(12) United States Patent
McNulty et al.

(10) Patent No.: US 10,802,065 B2
(45) Date of Patent: Oct. 13, 2020

(54) WEARABLE ELECTRIC FIELD DETECTOR

(71) Applicant: HD Electric Company, Waukegan, IL (US)

(72) Inventors: William John McNulty, Washington, DC (US); James S. Buchanan, Northbrook, IL (US); Michael S. Garner, North Barrington, IL (US); Michael Z. Standiford, Libertyville, IL (US)

(73) Assignee: GREENLEE TOOLS, INC., Rockford, IL (US)

( * ) Notice: Subject to any disclaimer, the term of this patent is extended or adjusted under 35 U.S.C. 154(b) by 302 days.

(21) Appl. No.: 15/954,899

(22) Filed: Apr. 17, 2018

(65) Prior Publication Data

US 2018/0299496 A1 Oct. 18, 2018

Related U.S. Application Data

(60) Provisional application No. 62/486,672, filed on Apr. 18, 2017.

(51) Int. Cl.
*G01R 29/08* (2006.01)
*G08B 7/06* (2006.01)
(Continued)

(52) U.S. Cl.
CPC ........... *G01R 29/0857* (2013.01); *G01R 1/04* (2013.01); *G01R 19/155* (2013.01); *G08B 7/06* (2013.01); *G08B 21/02* (2013.01)

(58) Field of Classification Search
CPC .... G01R 29/0857; G01R 1/04; G01R 19/155; G08B 7/06; G08B 21/02
(Continued)

(56) References Cited

U.S. PATENT DOCUMENTS 4,714,915 A 12/1987 Hascal et al.
5,001,455 A 3/1991 Starchevich
(Continued)

FOREIGN PATENT DOCUMENTS

EP 1296150 3/2003
EP 2746784 A2 6/2014
(Continued)

OTHER PUBLICATIONS

Brochure: "Sound Permeable Waterproof Film," Seiren Co., LTD., Osaka, Japan, www.seiren.com/seiren, 2014, 1 page.
(Continued)

*Primary Examiner* — Farhana A Hoque
(74) *Attorney, Agent, or Firm* — Klintworth & Rozenblat IP LLP

(57) ABSTRACT

A wearable electric field detector configured to be worn by a wearer in an environment includes inner and outer housings which are movable relative to each other between a closed position and an open position. When in the closed position, a body of the inner housing is concealed within the outer housing, and when in the open position, the body is partially visible to visually indicate that the detector is open. The detector includes field detection circuitry which is configured to detect voltage in an electric field in the environment around the wearer. The circuitry is in communication with at least one of a speaker and a light source which are configured to be activated by the field detection circuitry.

23 Claims, 14 Drawing Sheets

(51) Int. Cl.
*G01R 19/155* (2006.01)
*G01R 1/04* (2006.01)
*G08B 21/02* (2006.01)

(58) Field of Classification Search
USPC .......................................... 324/72; 340/660
See application file for complete search history.

(56) References Cited

U.S. PATENT DOCUMENTS

| | | | |
|---|---|---|---|
| 5,814,968 | A | 9/1998 | Lovegreen et al. |
| 6,170,607 | B1 | 1/2001 | Freeman et al. |
| 6,329,924 | B1 * | 12/2001 | McNulty ............ G01R 29/0857 340/552 |
| 6,677,743 | B1 | 1/2004 | Coolidge et al. |
| 6,998,832 | B1 | 2/2006 | McNulty |
| D577,300 | S | 9/2008 | Radecke et al. |
| D622,956 | S | 9/2010 | Hoffman |
| D650,116 | S | 12/2011 | Buyce et al. |
| 8,786,447 | B1 | 7/2014 | Wise |
| 9,116,178 | B1 | 8/2015 | Czarnecki |
| 9,215,394 | B2 | 12/2015 | Barnett et al. |
| 9,265,331 | B1 | 2/2016 | Hoffman |
| 2005/0040809 | A1 | 2/2005 | Uber, III et al. |
| 2005/0264427 | A1 | 12/2005 | Zeng et al. |
| 2006/0186872 | A1 | 8/2006 | Trethewey |
| 2007/0018841 | A1 | 1/2007 | Nickerson |
| 2007/0236358 | A1 | 10/2007 | Street et al. |
| 2010/0052929 | A1 | 3/2010 | Jackett et al. |
| 2014/0184425 | A1 | 7/2014 | Smith et al. |
| 2015/0091735 | A1 | 4/2015 | McNulty |
| 2015/0323580 | A1 | 11/2015 | Olson et al. |
| 2017/0045571 | A1 | 2/2017 | Joseph et al. |
| 2017/0205454 | A1 | 7/2017 | Rachakonda et al. |
| 2018/0336776 | A1 | 11/2018 | Liu |

FOREIGN PATENT DOCUMENTS

| | | |
|---|---|---|
| EP | 3124983 | 2/2017 |
| WO | 99/13698 | 3/1999 |
| WO | 2016014260 A1 | 1/2016 |

OTHER PUBLICATIONS

Webpage: "Personal Voltage Detector," HD Electric Co., Waukegan, IL, USA, http://www.hdelectriccompany.com/hd-electric-products/etm/personal-voltage-detectors/v-watch.htm, 2001, 2 pages.

Webpage: "P796 Mini Tube Cord Lock 1/8 Inch," Best Buy Button & Buckle, http://cord-lock.com/p796-mini-tube-cord-lock.aspx, 2009, 3 pages.

"Choose your RF Module," RF Modules / Synapse Wireless, http://www.synapse-wireless.com/iot-productsicore-iot/rf-modules/, Nov. 23, 2015, 2 pages.

"Hi Volt Alert System," Atlas Polar Company Lid., Toronto, ON, Canada, http://http://www.allaspolar.com/media/malerial-handling-equipment/hivoll-alerl/brochures/HiVolt-Alert-Equipmenl.pdf, Aug. 4, 2016, 2 pages.

"HVPS-110-W Wireless High Voltage Proximity Alanrn," Semrad ply Lid., Engadine New South Wale, Australia, http:// , vww_semrad.com.au/pdf/safe_systems/Sigalarm_Wireless_High_ Voltage_Proximity_Alarm.pdf, Mar. 21, 2015, 4 pages.

"SNAP Engine SM220 Series," Digi-Key Part No. 746-1053-1-ND, Catalog No. SM220UF1 synapse Wireless / RF / IF and RFID /DigiKey, http:/lwww.digikey.com/product-delail/en/synapse-wirelessSM220Ufl/746-1053-1-ND/5 . . . , 1995-2016, 2 pages.

Webpage: "V-Watch Personal Voltage Detectors," HD Electric Co., Waukegan, IL, USA, http://www.hdelectriccompany.com/assets/files/V-Watch%20Personal%20Personal%20Voltage%20Detectors%20Literature.pdf, 2015, 2 pages.

Extended European Search Report from corresponding European Application No. 18167882.2 dated Sep. 18, 2018, 2 pages.

Machine translation of EP 3124983 A1.

* cited by examiner

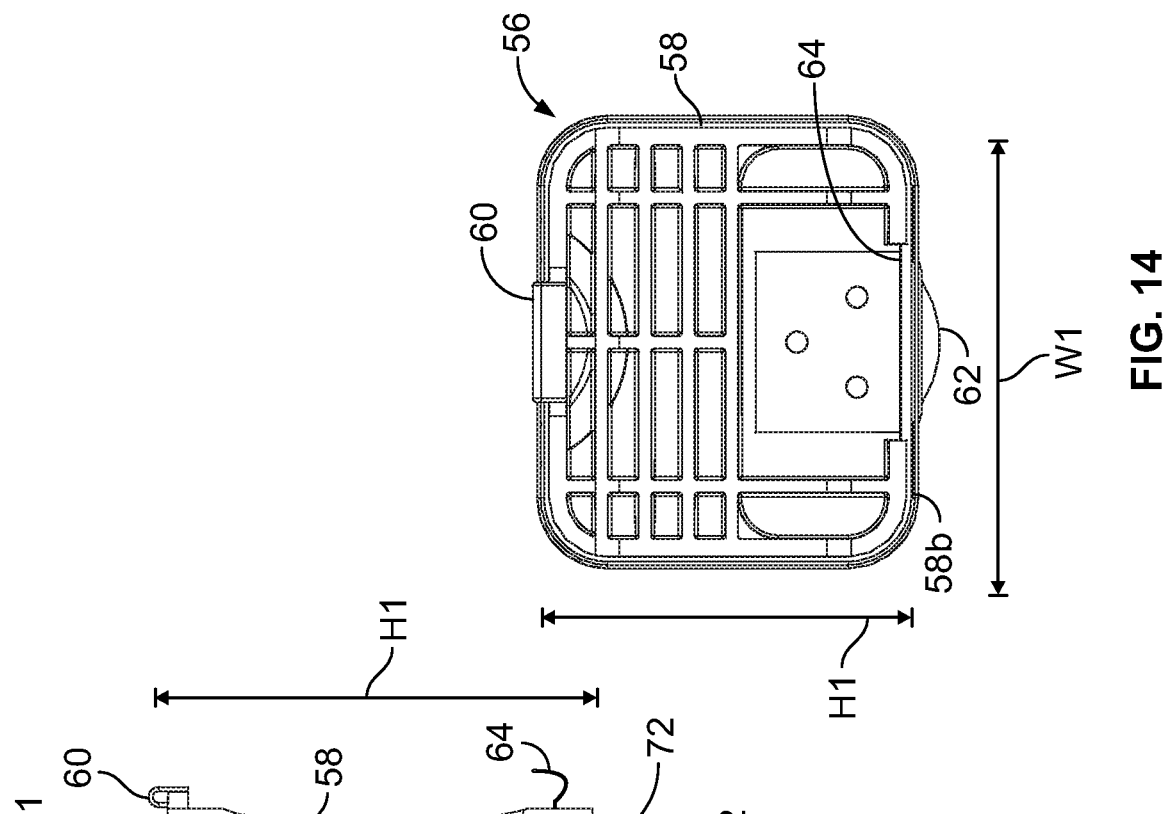
FIG. 14
FIG. 13
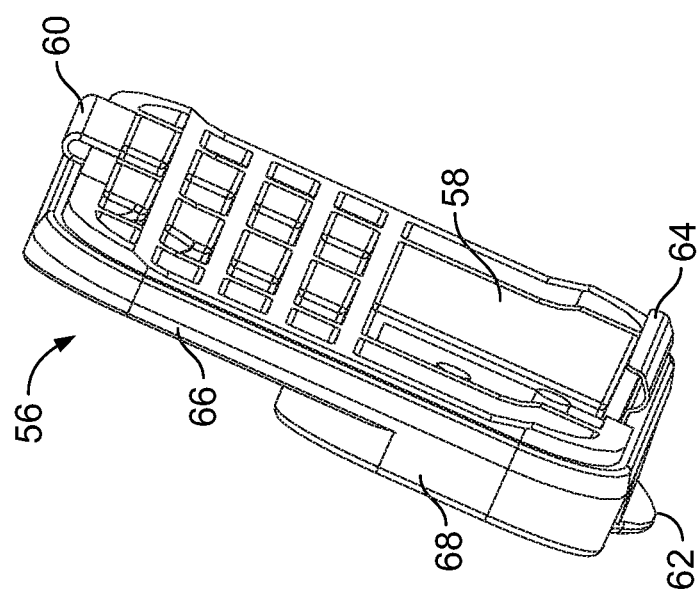
FIG. 12

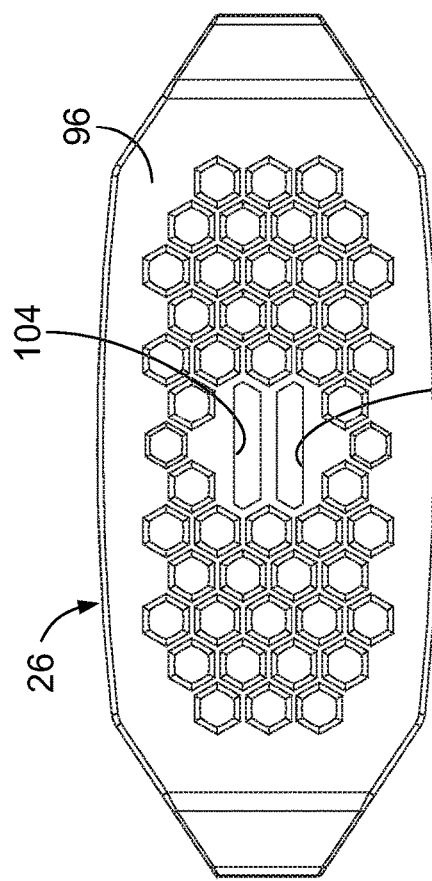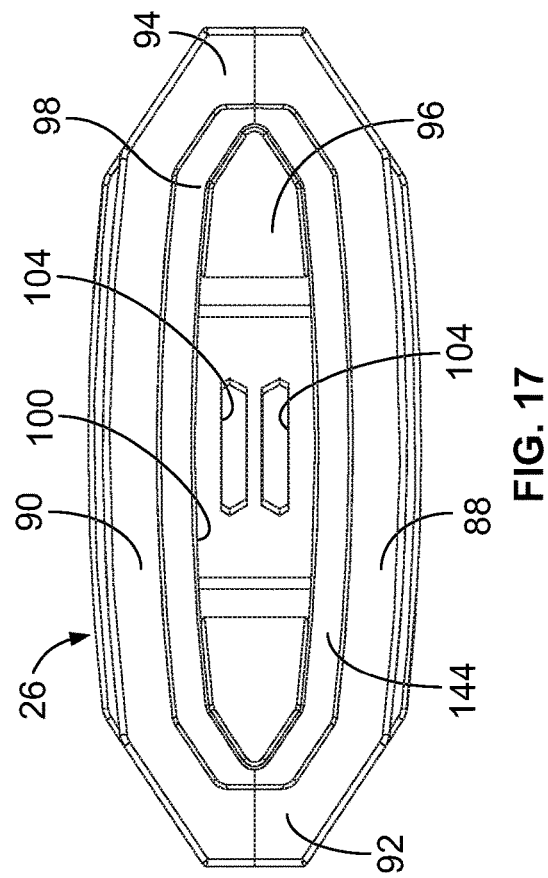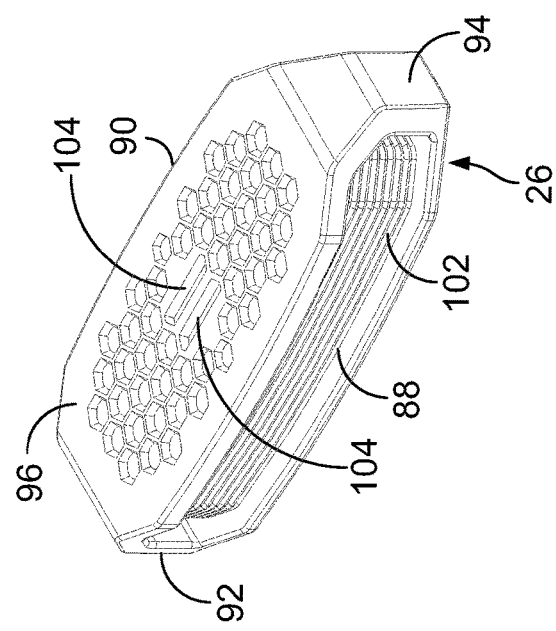

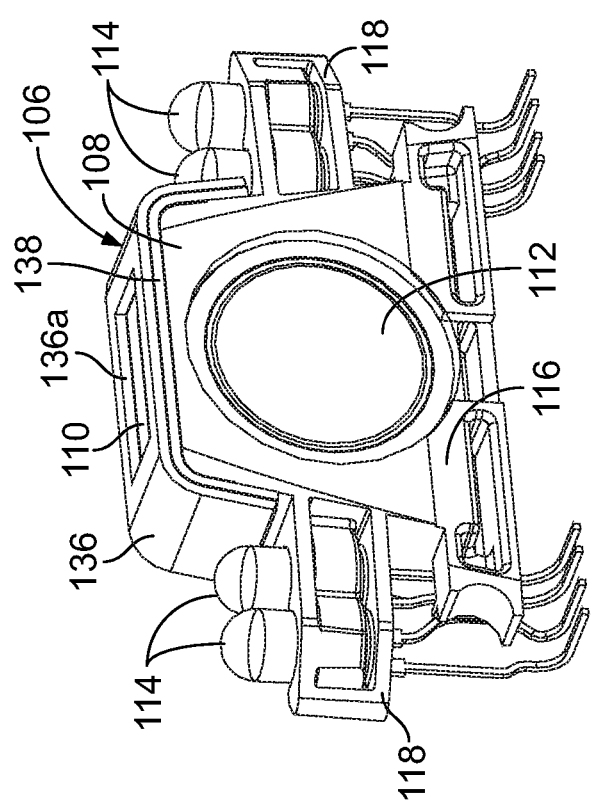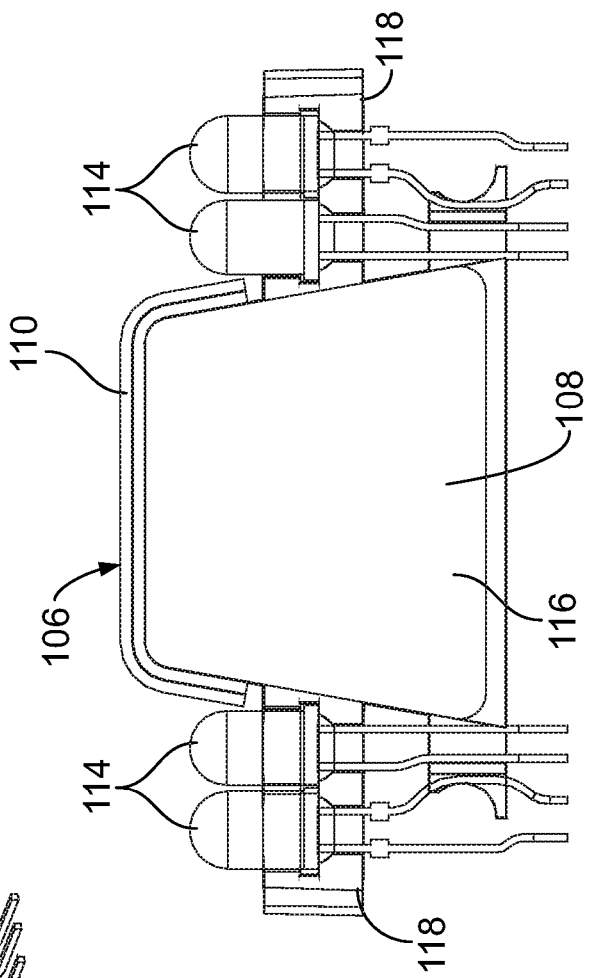
FIG. 18
FIG. 19

WEARABLE ELECTRIC FIELD DETECTOR

FIELD OF THE DISCLOSURE

The present disclosure generally relates to a wearable electric field detector which provides an early warning to the wearer of the proximity of nearby high voltage conductors.

BACKGROUND

Reliably detecting high voltage on distribution and transmission voltage power lines is critical to the jobs performed by electric utility linemen. These jobs are performed more quickly and safely when the voltage detection is also convenient and easy to use.

SUMMARY

In an embodiment, a wearable electric field detector is provided. The wearable electric field detector is configured to be worn by a wearer in an environment. The wearable electric field detector includes inner and outer housings which are movable relative to each other between a closed position and an open position. When in the closed position, a body of the inner housing is concealed within the outer housing, and when in the open position, the body is partially visible to visually indicate that the wearable electric field detector is open. The wearable electric field detector includes field detection circuitry which is configured to detect voltage in an electric field in the environment around the wearer. The circuitry is in communication with at least one of a speaker and a light source which are configured to be activated by the field detection circuitry.

This Summary is provided merely for purposes of summarizing some example embodiments so as to provide a basic understanding of some aspects of the disclosure. Accordingly, it will be appreciated that the above described example embodiments are merely examples and should not be construed to narrow the scope or spirit of the disclosure in any way. Other embodiments, aspects, and advantages of various disclosed embodiments will become apparent from the following detailed description taken in conjunction with the accompanying drawings, which illustrate, by way of example, the principles of the described embodiments.

BRIEF DESCRIPTION OF THE DRAWINGS

The organization and manner of the structure and operation of the disclosed embodiments, together with further objects and advantages thereof, may best be understood by reference to the following description, taken in connection with the accompanying drawings, which are not necessarily drawn to scale, wherein like reference numerals identify like elements in which:

FIG. 12 depicts a front perspective view of the battery door which is attached to the body of the inner housing;

FIG. 13 depicts a side elevation view of the battery door;

FIG. 14 depicts a front elevation view of the battery door;

FIG. 15 depicts a top perspective view of a cap of the inner housing of the wearable electric field detector;

FIG. 16 depicts a top plan view of the cap of the inner housing;

FIG. 17 depicts a bottom plan view of the cap of the inner housing;

FIG. 18 depicts a perspective view of an acoustic and light chamber mounted within the cap of the inner housing;

FIG. 19 depicts an elevation view of the acoustic and light chamber;

DETAILED DESCRIPTION OF THE ILLUSTRATED EMBODIMENTS

Figure 1:
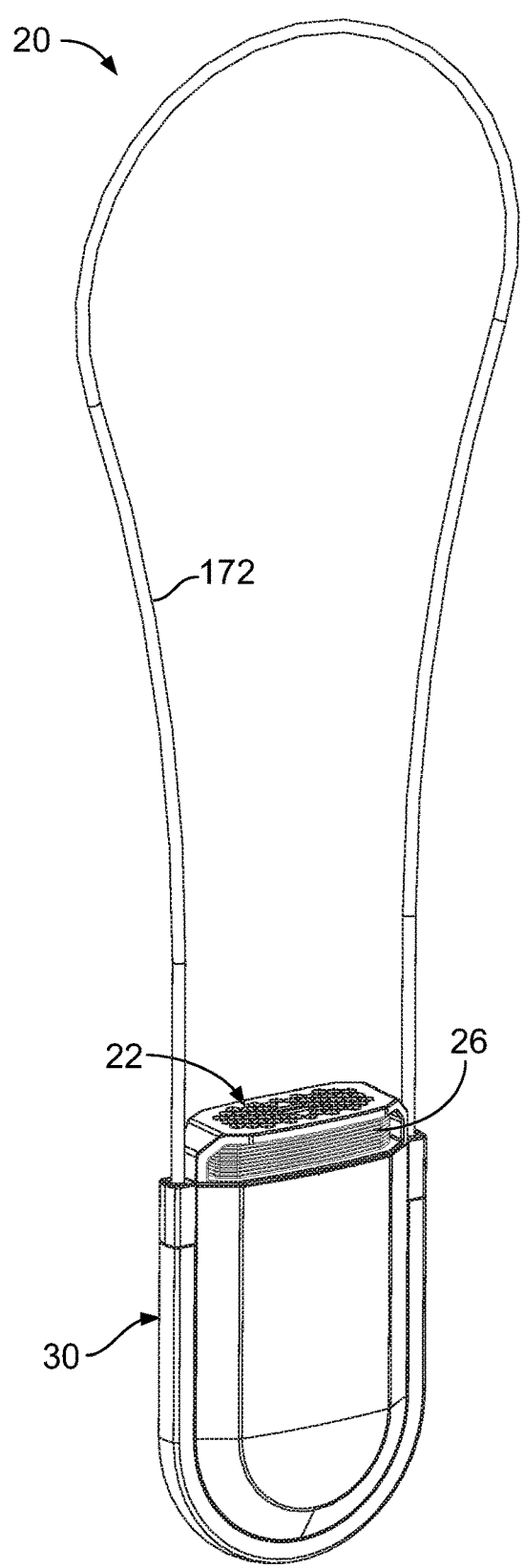
FIG. 1 depicts a front perspective view of a wearable electric field detector in a closed position.

While the disclosure may be susceptible to embodiment in different forms, there is shown in the drawings, and herein will be described in detail, a specific embodiment with the understanding that the present disclosure is to be considered an exemplification of the principles of the disclosure, and is not intended to limit the disclosure to that as illustrated and described herein. Therefore, unless otherwise noted, features disclosed herein may be combined together to form additional combinations that were not otherwise shown for purposes of brevity. It will be further appreciated that in some embodiments, one or more elements illustrated by way of example in a drawing(s) may be eliminated and/or substituted with alternative elements within the scope of the disclosure.

The present disclosure relates to the field of voltage detection, and more particularly to a wearable electric field detector 20. The wearable electric field detector 20 is designed to provide an early warning to the wearer of the proximity of nearby high voltage conductors. In some embodiments, the high voltage conductors are alternating current (AC) conductors.

Figure 2:
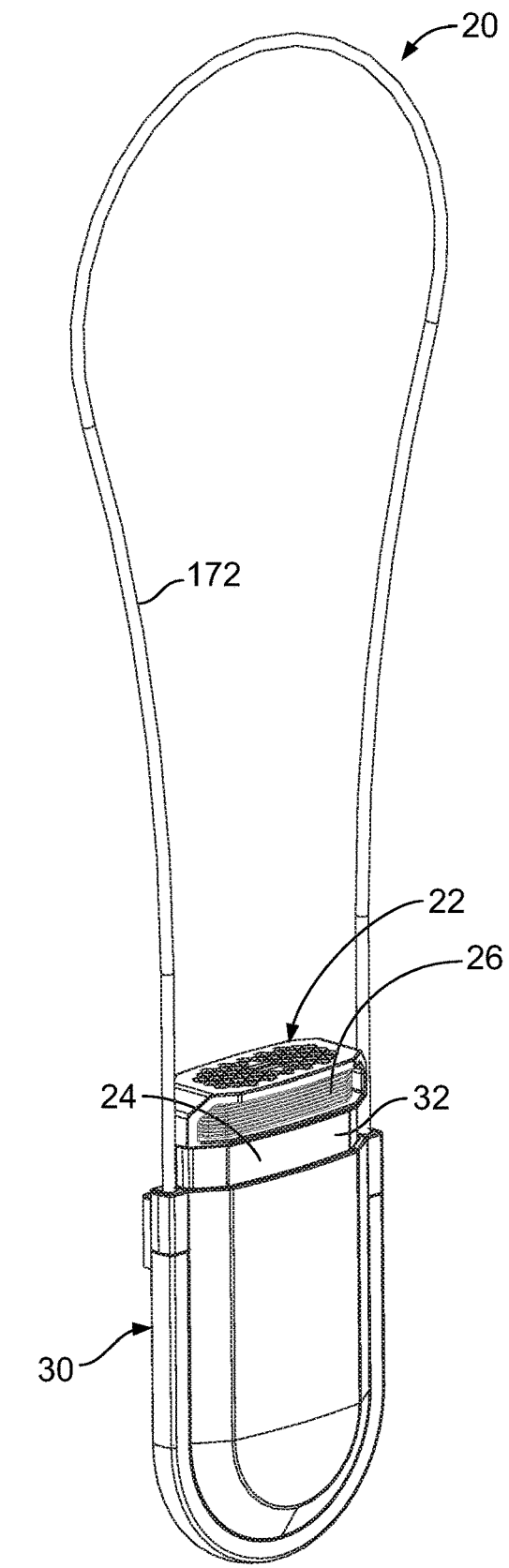
FIG. 2 depicts a front perspective view of the wearable electric field detector in an open position.
Figure 3:
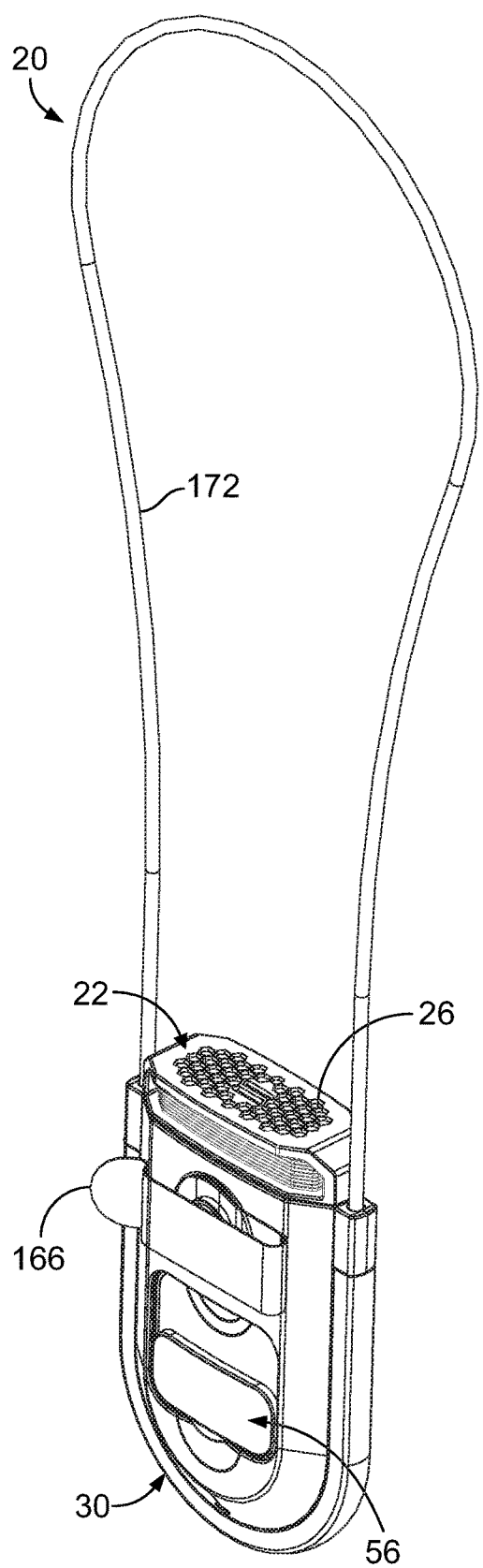
FIG. 3 depicts a rear perspective view of the wearable electric field detector in the closed position.
Figure 4:
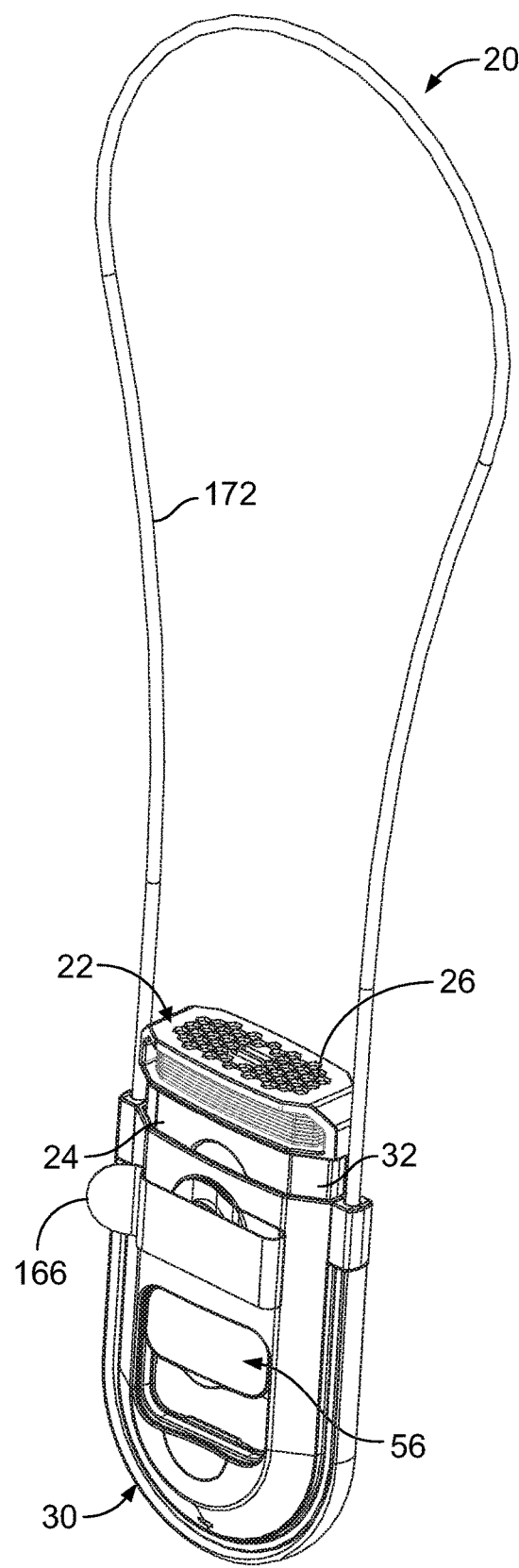
FIG. 4 depicts a rear perspective view of the wearable electric field detector in the open position.
Figure 6:
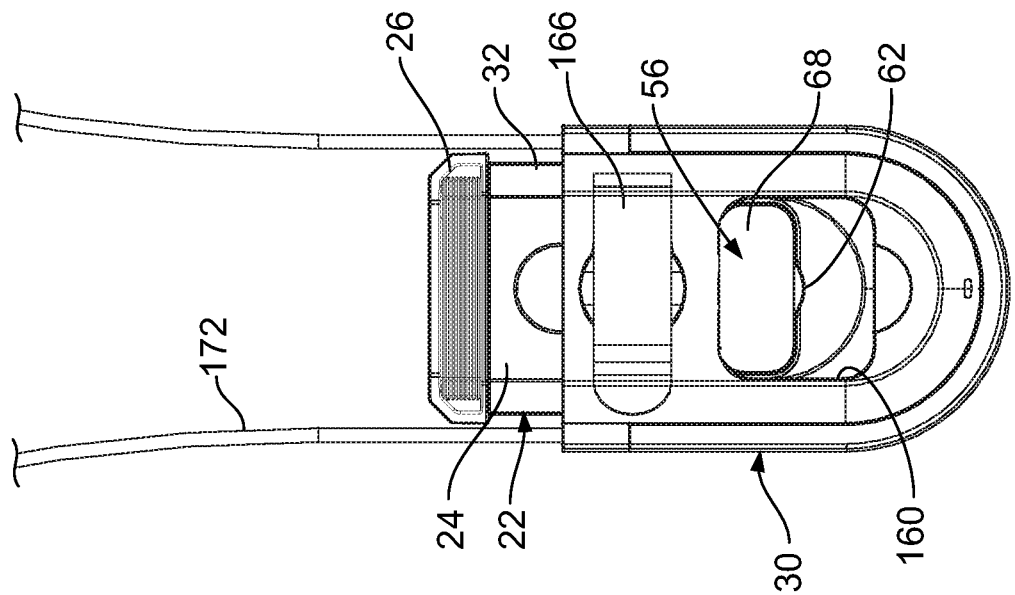
FIG. 6 depicts a rear elevation view of the wearable electric field detector in the open position.
Figure 5:
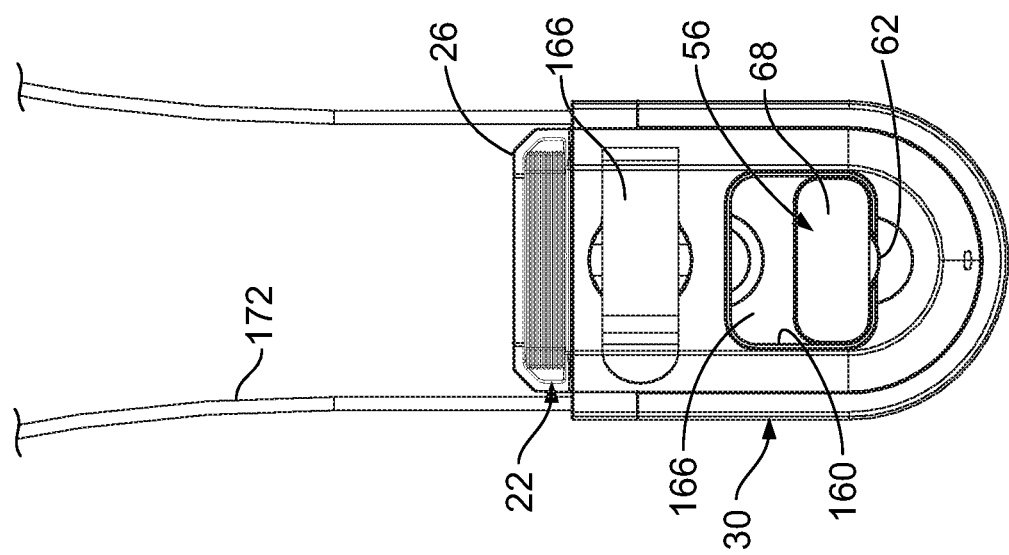
FIG. 5 depicts a rear elevation view of the wearable electric field detector in the closed position.

Generally, the wearable electric field detector 20 includes an inner housing 22 which generally includes a body 24 and cap 26 which houses electrical components 28 therein, and an outer housing 30. In a closed position as shown in FIGS. 1, 3 and 5, the inner housing 22 is fully seated within the outer housing 30 and only the cap 26 of the inner housing 22 is exposed outwardly of the outer housing 30. In an open position as shown in FIGS. 2, 4 and 6, the cap 26 and an upper portion 32 of the body 24 of the inner housing 22 extend from the outer housing 30 and are exposed.

Figure 7:
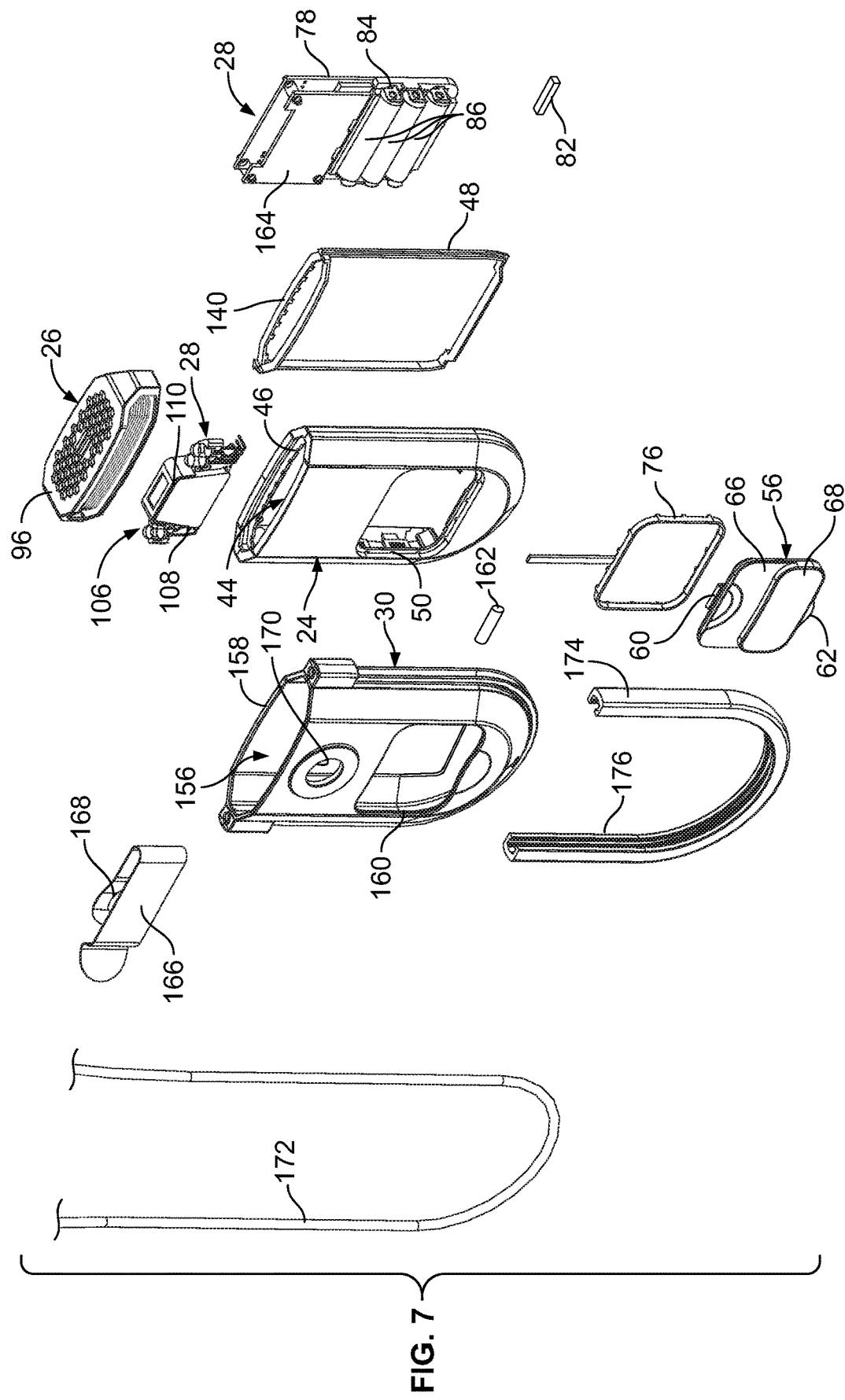
FIG. 7 depicts an exploded, rear perspective view of the wearable electric field detector.

As shown in FIGS. 8-11, the body 24 of the inner housing 22 has front and rear walls 34, 36, with side walls 38, 40 extending between the front and rear walls 34, 36, and a bottom wall 42 closing the lower ends of the front, rear and side walls 34, 36, 38, 40 such that an upwardly facing open-ended cavity 44, see FIG. 7, is formed within the body 24. The cavity 44 defines an opening 46 see FIG. 7, in the upper end of the body 24. In an embodiment, the body 24 is formed of plastic. In an embodiment, the front and rear walls 34, 36 are planar, and the side walls 38, 40 and the bottom wall 42 have a front wall portion extending at an angle from the front wall 34, a rear portion extending at an angle from the rear wall 36, and a central section which is perpendicular to the front and rear walls 34, 36. In an embodiment, the lower edges of the front and rear walls 34, 36 are curved and the bottom wall 42 is curved.

In some embodiments, the body 24 is formed of a first part having the front wall 34 and a front portion of the side walls 38, 40 and the bottom wall 42 and a second part having the rear wall 36 and a rear portion of the side walls 38, 40 and the bottom wall 42. The parts are mated together by suitable known means. In an embodiment, a gasket 48, see FIG. 7, is provided between the parts to provide a seal. In an embodiment, the parts are connected together by mating latch arms. In an embodiment, the parts are connected together by ultrasonic welding. Other means for mating the parts together are within the scope of the present disclosure.

Figure 11:
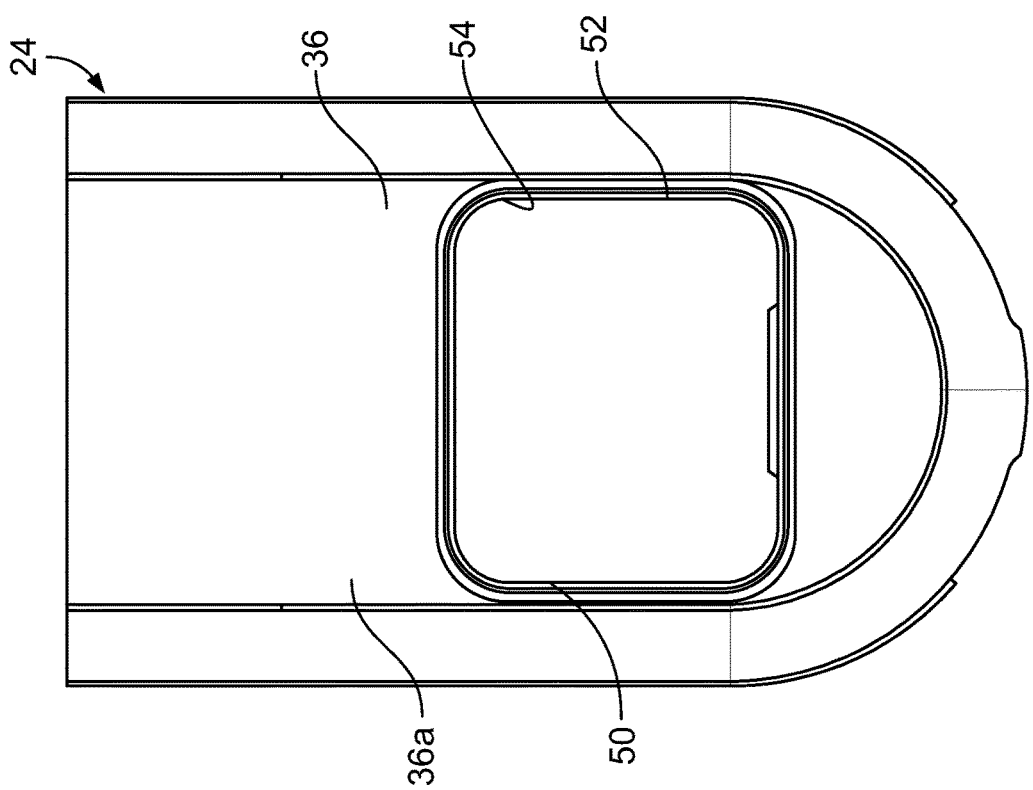
FIG. 11 depicts a rear elevation view of the body of the inner housing with a battery door omitted.
Figure 20:
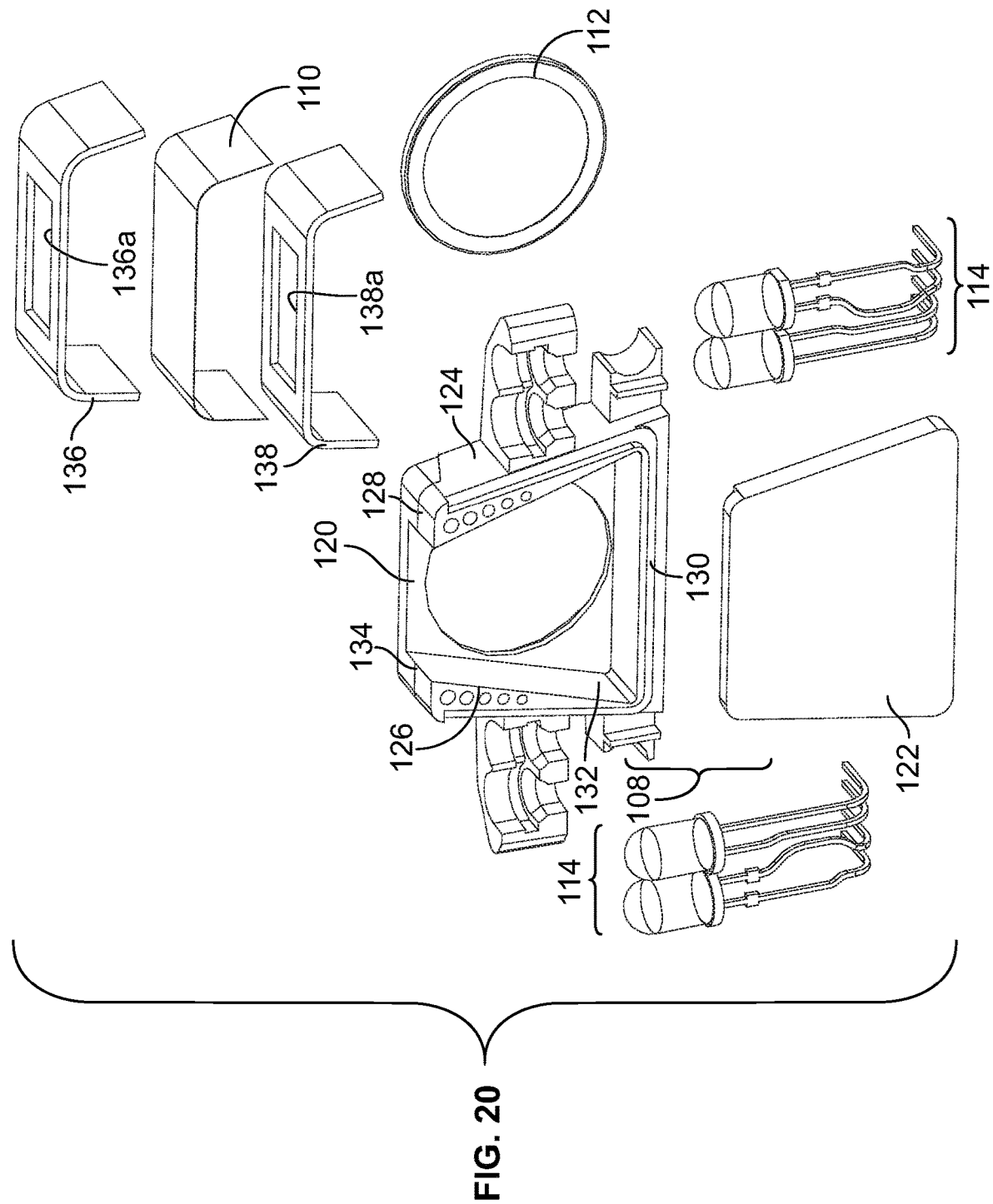
FIG. 20 depicts an exploded is an exploded perspective view of the acoustic and light chamber.

A battery door opening 50, see FIG. 11, is provided through the rear wall 36. The battery door opening 50 has an outer portion which forms a recess 52 around the perimeter of the battery door opening 50 and extends from the outer surface 36a of the rear wall 36 and an inner portion which forms a through opening 54 and extends from the recess 52 to the inner surface 36b of the rear wall 36.

The body 24 of the inner housing 22 further includes a battery door 56, FIGS. 12-14, attached to the rear wall 36. In an embodiment, the battery door 56 is formed of a wall 58, a latch ear 60 extending from an end of the wall 58, an engagement ear 62 extending from the opposite end of the wall, and a spring arm 64 extending from the wall 58.

The wall 58 has an upper portion 66 and a lower portion 68. As shown in FIGS. 13 and 14, the wall 58 has a height H1 which is defined from an upper end of the wall 58 to a lower end of the wall 58, and a width W1 which is defined from one side of the wall 58 to the other side of the wall 58. As shown in FIG. 13, the upper portion 66 of the wall 58 has a thickness T1 defined between outer and inner surfaces of the upper portion 66, and the lower portion 68 has a thickness T2 defined between outer and inner surfaces of the lower portion 68. The thickness T1 of the upper portion 66 is less than the thickness T2 of the lower portion 68, such that a shoulder 70 is formed between the upper and lower portions 66, 68.

The latch ear 60 extends from the inner surface of the wall 58. The engagement ear 62 extends from the wall 58 at an opposite end of the wall 58 to that which the latch ear 60 extends. The engagement ear 62 has a width which is substantially less than the width of the wall 58, such that a space 72 is formed between an inner surface of the engagement ear 62 and the inner surface of the wall 58. The spring arm 64 extends from the inner surface of the wall 58 and from the same end of the wall 58 as the engagement ear 62. In an embodiment, the latch ear 60 extends outwardly from the upper end of the wall 58, and the engagement ear 62 and the spring arm 64 extend from the lower end of the wall 58. In an embodiment, the spring arm 64 has a hook shaped end. In some embodiments, the spring arm 64 is formed of the same material as the wall 58, and in some embodiments is integrally formed therewith. In some embodiments, the spring arm 64 is formed of a different material than the material of the wall 58 and is attached thereto.

Figure 10:
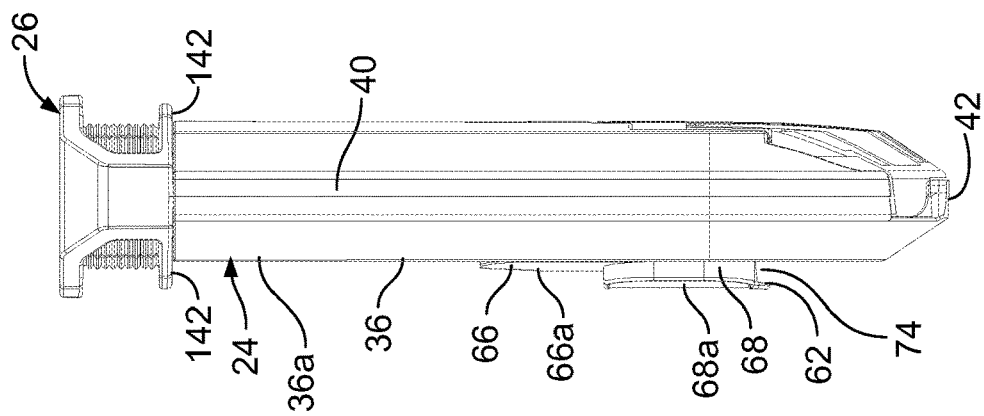
FIG. 10 depicts a side elevation view of the body of the inner housing.
Figure 9:
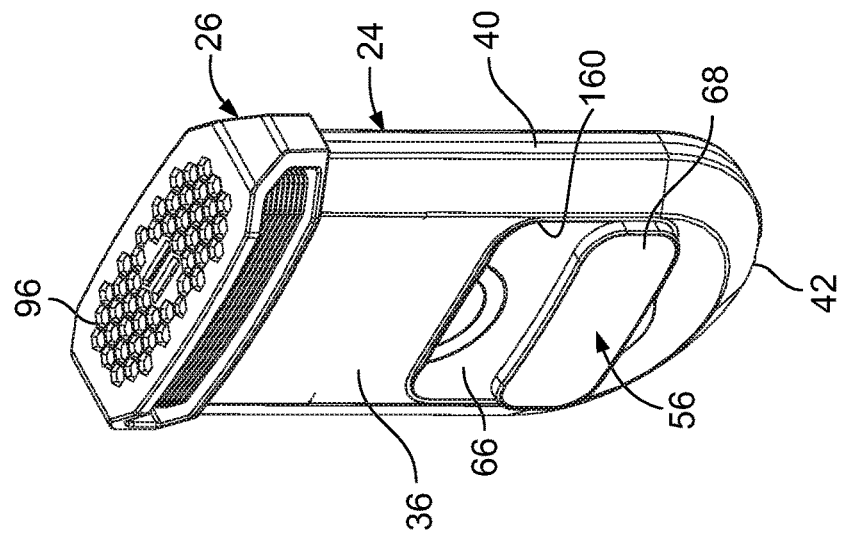
FIG. 9 depicts a rear perspective view of the body of the inner housing.
Figure 8:
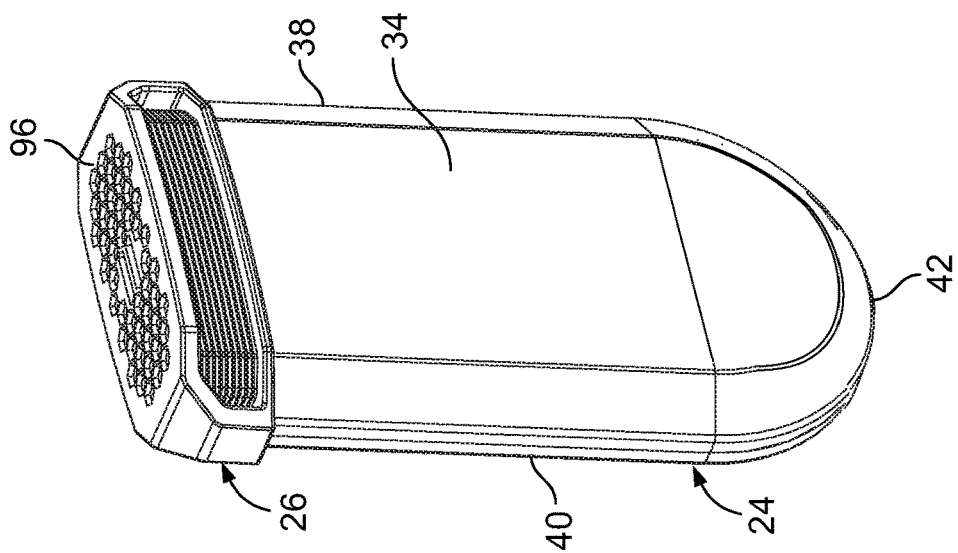
FIG. 8 depicts a front perspective view of a body of an inner housing of the wearable electric field detector.

The battery door 56 is removably mounted to the rear wall 36 of the body 24. To attach the battery door 56, the perimeter of the battery door 56 seats within the recess 52, the hook of the spring arm 64 and the latch ear 60 engage with the inner surface 36b of the rear wall 36. When the battery door 56 is mounted to the rear wall 36 of the body 24, the outer surface 66a of the upper portion 66 of the battery door 56 wall is flush with, or generally flush with, the outer surface 36a of the rear wall 36 of the body 24, and the outer surface 68a of the lower portion 68 of the battery door 56 extends outwardly from the outer surface 36a of the rear wall 36 of the body 24. When the battery door 56 is mounted to the rear wall 36 of the body 24, the engagement ear 62 is spaced from the outer surface 36a of the rear wall 36 of the body 24 such that a finger space 74, see FIG. 10, is provided. In an embodiment, the battery door 56 and the recess 52 are rectangular. A gasket 76, see FIG. 7, is provided between the battery door 56 and the rear wall 36 of the body 24 to provide a seal between the parts. In an embodiment, the seal is at least partially water resistant. In an embodiment, the seal is 100% absolute waterproof.

As shown in FIG. 7, the electrical components 28 within the body 24 includes a circuit board 78, which is some embodiments is a printed circuit board or a printed wiring board. The circuit board 78 is mounted within the cavity 44 formed in the body 24. The circuit board 78 includes field detection circuitry 80 which is configured to detect voltage in the electric field in the environment around the wearer of the wearable electric field detector 20 and to determine whether the detected voltage meets or exceeds a voltage threshold, and in response to the detection by the field detection circuitry 80 of an overvoltage, alerts the wearer of the overvoltage condition. An example field detection circuitry 80 is manufactured by HD Electric Company, for example, as used in the WATCHMAN® work area voltage detector, part number WM-01. The circuit board 78 further includes a switch 82, such as a reed switch, mounted thereon which is in communication with the field detection circuitry 80. It will be appreciated, however, that a reed switch is one example of a switch that may be used to implement switch 82, and where the switch 82 is referred to herein as a "reed switch", it is by way of example, and not by way of limitation.

A battery holder 84, which holds the power supply which in some embodiments is one or more batteries 86, is mounted within the inner housing 22 and in some embodiments, is attached to the circuit board 78. The battery holder 84 is positioned such that it is proximate to the battery opening 50 in the body 24. When the battery door 56 is opened, the one or more batteries 86 can be removed from the battery holder 84 and replaced. The one or more batteries 86 are in the electrical contact with the circuit board 78 and provide power to the circuit board 78 as discussed herein.

As shown in FIGS. 15-17, the cap 26 has front and rear walls 88, 90, with side walls 92, 94 extending between the front and rear walls 88, 90, and a top wall 96 closing the upper ends of the front, rear and side walls 88, 90, 92, 94 such that a downwardly facing open-ended cavity 98 is formed within the cap 26. The cavity 98 defines an opening 100 in the lower end of the cap 26. The cap 26 is formed of translucent materials. In an embodiment, the cap 26 is formed of plastic. In an embodiment, outer surfaces of the front and rear walls 88, 90 have a recessed portion which has a plurality of ribs 102 which enable a wearer to more easily grip the cap 26.

The top wall 96 has one or more openings 104 provided therethrough which extend from an upper surface to a lower surface of the top wall 96. The one or more openings 104 are in communication with the cavity 98.

An acoustic and light chamber 106, see FIGS. 7 and 18-20, is mounted within the cap 26. The acoustic and light chamber 106 includes a housing 108 which houses some of the electrical components 28 and a water-resistant fabric 110 which protects the electrical components 28. The electrical components 28 in the acoustic and light chamber 106 include, but are not limited to, a speaker 112 mounted within the housing 108, and plurality of lights 114 mounted to the housing 108.

In an embodiment, the housing 108 has a central body 116 with an arm 118 extending outwardly from each side of the central body 116. The central body 116 has front and rear walls 120, 122, with side walls 124, 126 extending between the front and rear walls 120, 122, and top and bottom walls 128, 130 closing the upper and lower ends of the walls 120, 122, 124, 126 such that cavity 132 is formed therein. Electrical components (not shown) can be provided in the cavity 132. A speaker opening 134 is provided through the top wall 128 of the housing. In an embodiment, the arms 118 extend outwardly from the side walls 124, 126.

One or more layers of water-resistant fabric 110 is attached to the top wall 128 of the housing 108 and cover the speaker opening 134 to deter the ingress of water into the housing 108. In an embodiment, the water-resistant fabric 110 is between two layers of foam 136, 138; each layer of foam 136, 138 having an opening 136a, 138a therethrough which aligns with the speaker opening 134 in the housing 108. The lower layer of foam 138 is attached by suitable means to the top wall 128 of the housing 108. It will be appreciated that one or more layers of an alternative water-resistant material, such as a waterproof film, may be used in addition to or in lieu of fabric 110 within the scope of the disclosure. In this regard, any material that is water resistant while providing for at least partial sound permeability may be used in some embodiments providing for protection against water ingress into the housing 108.

The lights 114 are attached to the arms 118 such that the illumination source of each light 114 is directed upwardly. Non-limiting examples of an illumination source includes, but is not limited to, light emitting diodes (LEDs), incandescent bulbs, etc.

The acoustic and light chamber 106 is mounted within the cap 26 such that the illumination sources of the lights 114 are proximate to the top wall 96 of the cap 26 and the speaker opening 134 is proximate to the one or more openings 104 in the top wall 96 of the cap 26. The water-resistant fabric 110 is visible through the one or more openings 104 and allows for sound to travel through the cap 26.

The cap 26 is attached to the upper end of the body 24 and closes the opening 46 of the body 24. In an embodiment, a gasket 140, see FIG. 7, is provided between the upper end of the body 24 and the lower end of the cap 26. The speaker 112 and the lights 114 are electrically connected to the circuit board 78.

In an embodiment, the cap 26 is wider than the body 24 such that an overhang 142, see FIG. 10, is formed by the cap 26. In an embodiment, the overhang 142 is formed around the entire perimeter of the cap 26. In some embodiments, the overhang 142 is formed around a portion or portions of the perimeter of the cap 26.

In some embodiments, an engagement flange 144, see FIG. 17, extends downwardly from the lower ends of the walls 88, 90, 92, 94 of the cap 26. In some embodiments, the engagement flange 144 extends around the entire perimeter formed by the walls 88, 90, 92, 94 of the cap 26. In some embodiments, the engagement flange 144 extends around a portion of the perimeter formed by the walls 88, 90, 92, 94 of the cap 26. In an embodiment, the engagement flange 144 is offset inwardly from the outer surfaces of the walls 88, 90, 92, 94 of the cap 26 and the engagement flange 144 is sized to fit within the opening 46 of the body 24.

Figure 23:
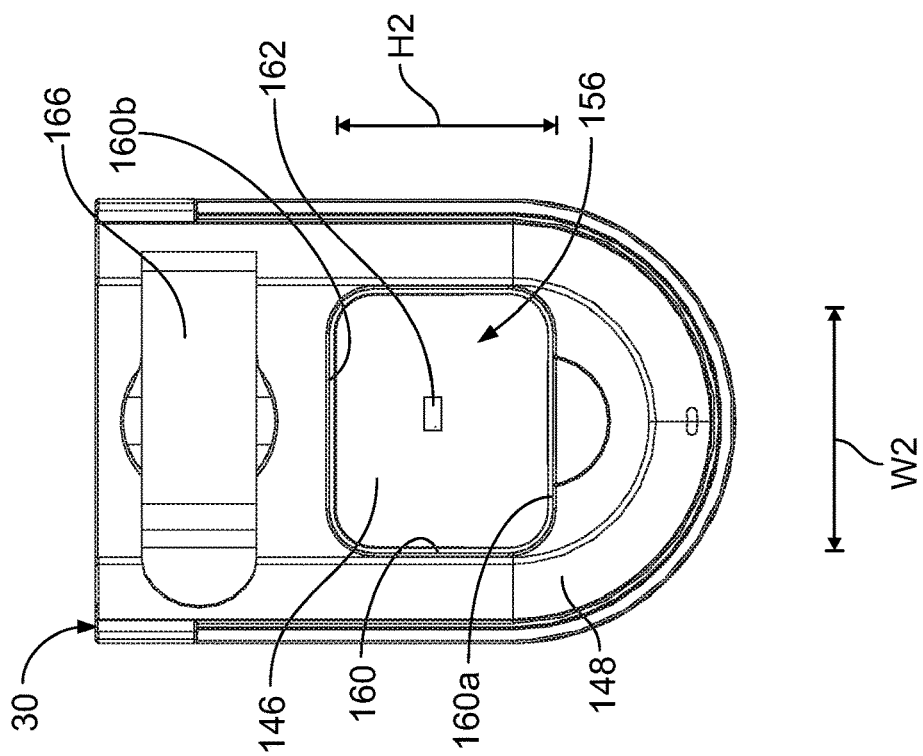
FIG. 23 depicts a rear elevation view of an embodiment of the outer housing.
Figure 22:
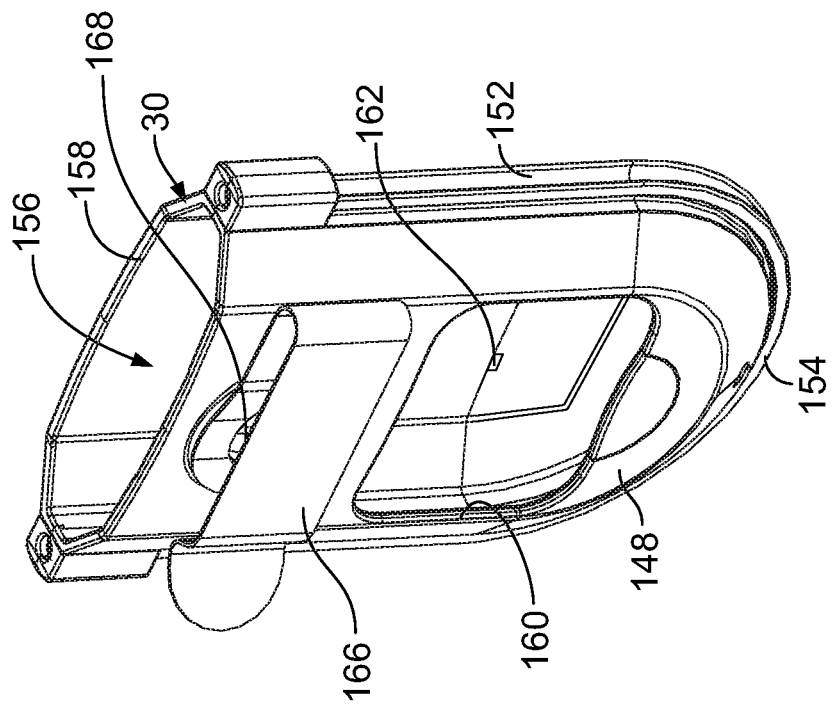
FIG. 22 depicts a rear perspective view of the outer housing.
Figure 21:
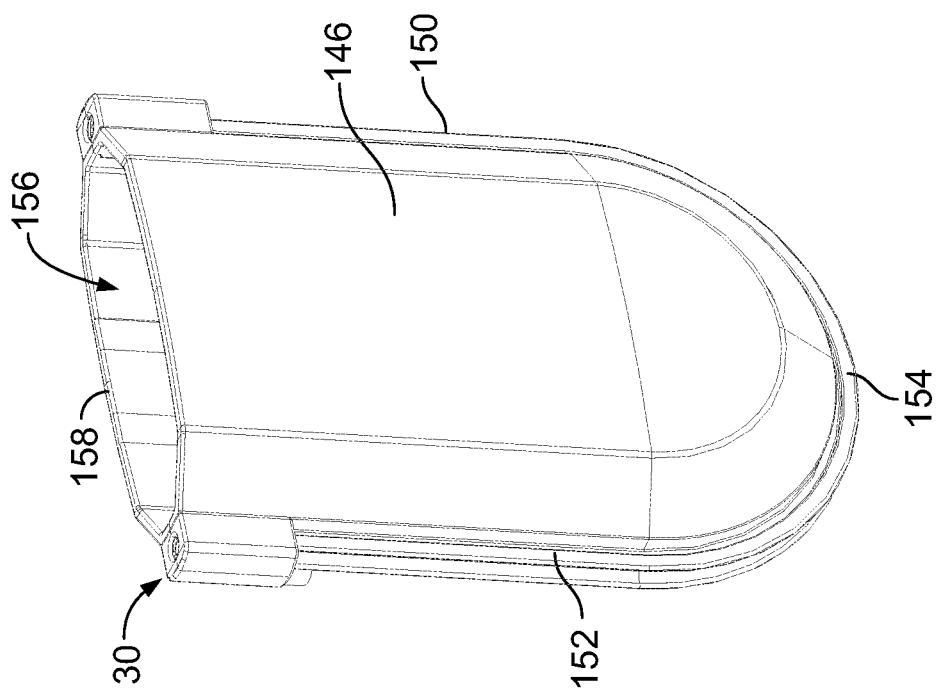
FIG. 21 depicts a front perspective view of an outer housing of the wearable electric field detector.

As shown in FIG. 21-23, the outer housing 30 has front and rear walls 146, 148, with side walls 150, 152 extending between the front and rear walls 146, 148, and a bottom wall 154 closing the lower ends of the front, rear and side walls 146, 148, 150, 152 such that an upwardly facing open-ended cavity 156 is formed within the outer housing 30. The cavity 156 defines an opening 158 in the upper end of the outer housing 30. In an embodiment, the outer housing 30 is formed of plastic. In an embodiment, the front and rear walls 146, 148 are planar, and the side walls 150, 152 and the bottom wall 154 have a front wall portion extending at an angle from the front wall 146, a rear portion extending at an angle from the rear wall 146, and a central section which is perpendicular to the front and rear walls 146, 148. In an embodiment, the lower edges of the front and rear walls 146, 148 are curved and the bottom wall 154 is curved.

In some embodiments, the outer housing 30 is formed of a first part having the front wall 146 and a front portion of the side walls 150, 152 and the bottom wall 154 and a second part having the rear wall 148 and a rear portion of the side walls 150, 152 and the bottom wall 154. The parts are mated together by suitable known means. In an embodiment, the parts are connected together by mating latch arms. In an embodiment, the parts are connected together by ultrasonic welding. Other means for mating the parts together are within the scope of the present disclosure.

A battery door opening 160 is provided through the rear wall 146. As shown in FIG. 23, the battery door opening 160 has a height H2 which is defined from an upper end of the battery door opening 160 to a lower end of the battery door opening 160, and a width W2 which is defined from one side of the battery door opening 160 to the other side of the battery door opening 160. The battery door 56 is sized such that it has a height H1 which is less than the height H2 of the battery door opening 160 and a width W1 which is less than the width W2 of the battery door opening 160.

A magnet 162, see FIGS. 22 and 23 is mounted on the inner surface of the front wall 146 of the outer housing 30 with in the cavity 156.

In some embodiments, the outer housing 30 is formed of a first part having the front wall and a front portion of the side walls and the bottom wall and a second part having the rear wall and a rear portion of the side walls and the bottom wall. The parts are mated together by suitable known means. In some embodiments, a gasket (not shown) is provided between the parts.

When assembled and in a closed position as shown in FIGS. 1, 3 and 5, the body 24 of the inner housing 22 seats within the cavity 156 of outer housing 30. When in the closed position, only the translucent cap 26 of the inner housing 22 is visible external to the outer housing 30 (if the engagement flange 144 is provided, the engagement flange 144 is not visible as it is inside the body 24 of the inner housing 22) at the top of the wearable electric field detector 20. The walls 34, 36, 38, 40, 42 of the body 24 and the upper portion 66 of the battery door 56 may abut against the walls 146, 148, 150, 152, 154 of the outer housing 30. The lower portion 68 of the battery door 56 extends through the battery door opening 160 in the rear wall 146 of the outer housing 30. In an embodiment, when assembled and in the closed position, a lower end 58a of the wall 58 of the battery door 56 is proximate to a lower edge 160a of the battery door opening 160. In this closed position, the battery door 56 is completely visible through the battery door opening 160. This allows a wearer to remove the battery door 56 by grasping the engagement ear 62 and pulling the battery door 56 outwardly from the inner housing 22 through the battery door opening 160 in the outer housing 30. When the battery door 56 is pulled by its engagement ear 62, the spring arm 64 flexes to release its engagement with the rear wall 146 and the latch ear 60 is slide out from under the rear wall 146 to allow the battery door 56 to be released.

In an embodiment, the inner housing 22 is slidable relative to the outer housing 30.

To open the wearable electric field detector 20 to place the wearable electric field detector 20 in an open position as shown in FIGS. 2, 4 and 6, the cap 26 is grasped by a wearer and pulled outwardly from the outer housing 30. As the cap 26 is pulled outwardly from the outer housing 30, the inner housing 22 slides relative to the outer housing 30 and exposes the upper portion 32 of the body 24 of the inner housing 22. The body 24 is formed of a different color than the outer housing 30. As an example, the body 24 is red, while the outer housing 30 is green. When the upper portion 32 of the body 24 of the inner housing 22 is exposed in the open position, the wearer is given a visual indication that the wearable electric field detector 20 has been opened since the differently colored upper portion 32 of the body 24 is now visible. During this movement, the lower portion 68 of the battery door 56 slides along the battery door opening 160 in the rear wall 146 of the outer housing 30. In an embodiment, the battery door 56 slides along the battery door opening 160 until the shoulder 70 of the battery door 56 contacts an upper edge 160b of the battery door opening 160. The upper portion 66 of the battery door 56 is proximate to the inner surface of the rear wall 146 of the outer housing 30 such that the upper portion 66 is not visible. Therefore, the battery door 56 cannot be removed in this open position since the upper portion 66 of the battery door 56 is behind the rear wall 146 of the outer housing 30.

When the inner housing 22 is pulled outwardly from the outer housing 30 to the open position, the reed switch 82 on the inner housing 22 comes into proximity with the magnet 162 on the outer housing 30. This closes the switch 82 which enables the electrical connection between the batteries 86 and the field detection circuitry 80 such that the wearable electric field detector 20 is turned on and activated.

As previously noted, the use of a reed switch to implement the switch 82 is described solely by way of example, and not by way of limitation. In this regard, any type of switch, sensor, or combination thereof that may be triggered to selectively provide an electrical connection between the batteries 86 and the field detection circuitry 80 in response to the inner housing 22 being pulled outwardly from the outer housing 30 to the open position may be substituted for the switch 82 within the scope of the disclosure.

To close the wearable electric field detector 20 into the closed position as shown in FIGS. 1, 3 and 5, the cap 26 is pushed inwardly into the outer housing 30 until the overhang 142 engages the upper end of the outer housing 30. As the cap 26 is pushed inwardly into the outer housing 30, the inner housing 22 slides relative to the outer housing 30 and the upper portion 32 of the body 24 of the inner housing 22 is hidden from view. During this movement, the lower portion 68 of the battery door 56 slides along the battery door opening 160 in the rear wall 146 of the outer housing 30. In an embodiment, the battery door 56 slides along the battery door opening 160 until the lower end 58a of the wall 58 of the battery door 56 contacts the lower edge 160a of the battery door opening 160 and the entire battery door 56 is visible through the battery door opening 160.

When the inner housing 22 is pushed inwardly into the outer housing 30 to the closed position, the switch 82 on the inner housing 22 is moved out of proximity of the magnet 162 on the outer housing 30. This opens the switch 82 thereby preventing an electrical connection between the batteries 86 and the field detection circuitry 80 such that the wearable electric field detector 20 is turned off and deactivated. As such, the batteries 86 supply power to the field detection circuitry 80 only when the wearable electric field detector 20 is open.

In some embodiments, an antenna 164 is provided within the inner housing 22 and is in communication with the circuit board 78. In some embodiments, the antenna 164 is attached to the circuit board 78.

In some embodiments, a spring clip 166, see FIG. 23, is attached to the rear wall 148 of the outer housing 30 by suitable means, such as a rivet 168. In some embodiments, the rear wall 148 of the outer housing 30 has rivet receiving opening 170 therethrough through which the rivet 168 extends. In an embodiment, the spring clip 166 is positioned above the battery door opening 160. A wearer can use the spring clip 166 to attach the wearable electric field detector 20 to the wearer's clothing.

In some embodiments, the wearable electric field detector 20 includes a lanyard 172 attached to the outer housing 30 by a lanyard housing 174. The lanyard housing 174 is attached to the outer housing 30 by suitable means, such as latches or ultrasonic welding. In some embodiments, the lanyard 172 is made of a fireproof material and may be formed of KEVLAR® material. In some embodiments, the lanyard housing 174 mirrors the shape of the outer housing 30. In an embodiment, the lanyard housing 174 is U-shaped. The lanyard housing 174 provides a passageway 176 through which the lanyard 172 extends. The wearer can wear the wearable electric field detector 20 around his/her neck by using the lanyard 172 such that the body 24 can be positioned at the chest of the wearer. In some embodiments, the lanyard 172 includes an adjustable spring clamp (not shown) to adjust the length of the lanyard 172; this spring clamp also releases the lanyard 172 when sufficient force is applied should the lanyard 172 become caught on an object.

Figure 24:
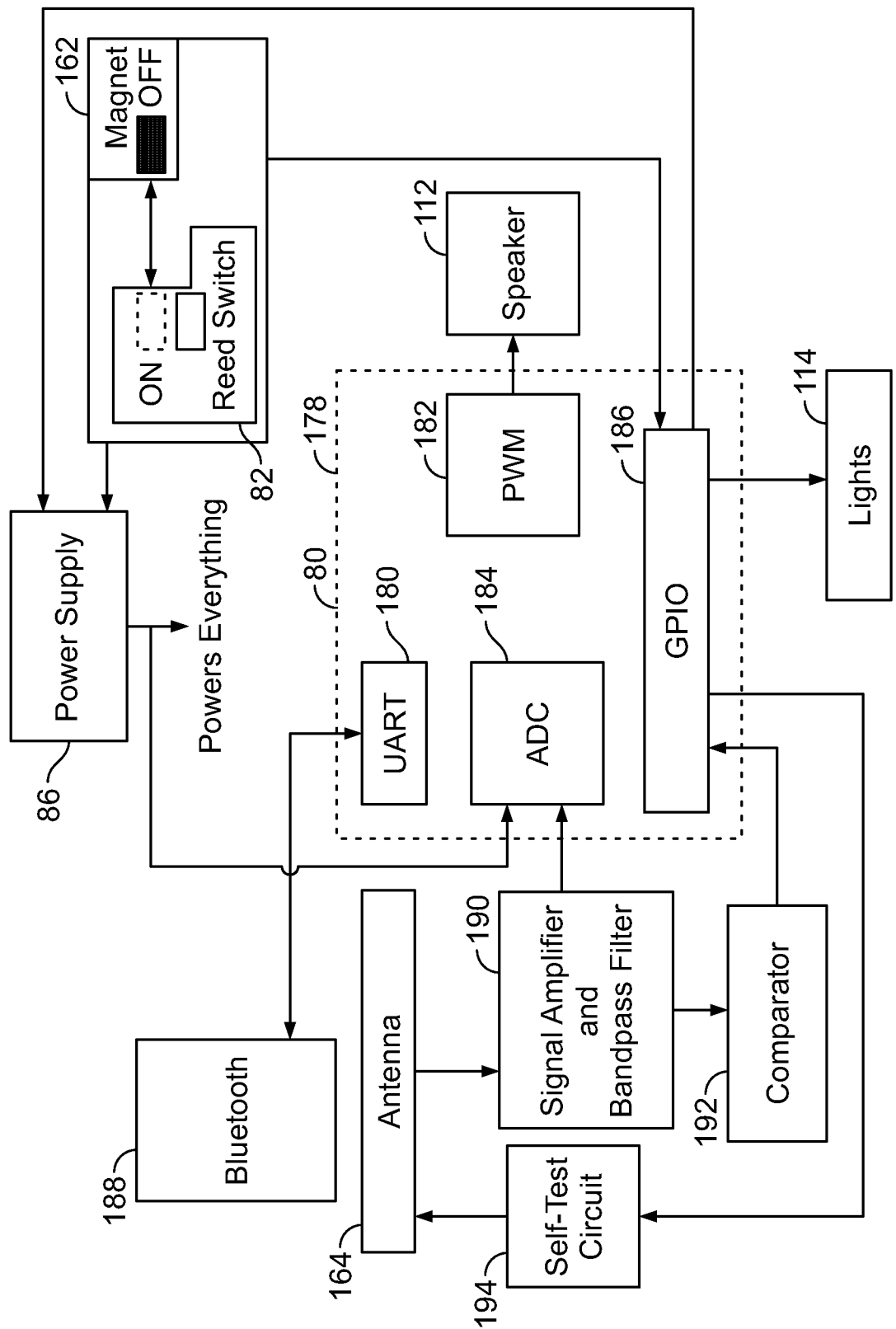
FIG. 24 depicts a circuit block diagram of the wearable electric field detector.

As shown in FIG. 24, the field detection circuitry 80 may include a processor 178. The processor 178 of some embodiments includes a universal asynchronous receiver/transmitter (UART) 180, a pulse width modulator (PWM) 182, an analog-to-digital converter (ADC) 184, and a general-purpose input/output (GPIO) 186. However, it will be appreciated that the configuration of processor 178 illustrated in FIG. 24 is provided by way of example and not by way of limitation, as the processor 178 may be embodied in a variety of forms. For example, the processor 178 may be embodied as various hardware-based processing means such as a microprocessor, a coprocessor, a controller or various other computing or processing devices including integrated circuits such as, for example, an ASIC (application specific integrated circuit), an FPGA (field programmable gate array), some combination thereof, or the like. Although illustrated as a single processor, it will be appreciated that the processor 178 may comprise a plurality of processors. The plurality of processors may be in operative communication with each other and may be collectively configured to perform one or more functionalities of the control apparatus as described herein. In some embodiments, the UART 180 is in communication with a Bluetooth device 188. The PWM 182 sends signals to the speaker 112 to activate the speaker 112. In some embodiments, the antenna 164 sends signals to a signal amplifier and bandpass filter 190. The signal amplifier and bandpass filter 190 sends signals to the ADC 184. The signal amplifier and bandpass filter 190 also sends signals to a comparator 192 which sends signals to the GPIO 186. The GPIO 186 sends signals to the lights 114 to activate the lights 114. The GPIO 186 sends signals to a self-test circuit 194. The self-test circuit 194 performs a complete voltage detection system test of the wearable electric field detector 20. The self-test circuit 194 sends signals to the antenna 164. The GPIO 186 sends signals to the power supply 86. The reed switch 82 sends signals to the GPIO 186 and to the power supply 86.

In some embodiments, when the wearable electric field detector 20 is opened such that the wearable electric field detector 20 is activated, a complete voltage detection system test is performed by the self-test circuit 194. In some such embodiments, test results are confirmed by emitting a turn-on audio tone from the speaker 112 and/or activating the lights 114. Since the battery door 56 only allow access to the batteries 86 when the wearable electric field detector 20 is closed and turned off, this assures that each time the batteries 86 are replaced a complete voltage detection system test is performed by the self-test circuit 194 before the wearable electric field detector 20 can be used. In some embodiments, when the wearable electric field detector 20 is closed such that the wearable electric field detector 20 is deactivated, a turn-off audio tone is emitted from the speaker 112. In some embodiments, the turn-on audio tone is different from the turn-off audio tone. As an example, the turn-on audio tone plays a series of tones in ascending order, and the turn-off audio tone plays a series of tones in descending order.

If the wearer comes into proximity of a high voltage conductor when the wearable electric field detector 20 is in the open position, the wearable electric field detector 20 will provide an audible indication of the high voltage by activating the speaker 112 and/or will provide a visual signal by activating the lights 114. In some embodiments, the field detection circuitry 80 detects a single voltage level when in the open position, or multiple voltage levels in the open position. When this voltage level is detected, the wearable electric field detector 20 activates the speaker 112 and/or the lights 114. The speaker 112 and the lights 114 are directed up towards the head of the wearer to help improve recognition of the indication of the high voltage.

If the wearer comes into proximity of a high voltage conductor when the wearable electric field detector 20 is in the open position, the wearable electric field detector 20 will provide an audible signal by activating the speaker 112 and/or will provide a visual indication of the high voltage by activating the lights 114. In some embodiments, the field detection circuitry 80 detects multiple voltage levels when in the open position. When a first voltage level is detected, the wearable electric field detector 20 activates the speaker 112 in a particular pattern and/or at a particular volume, and/or activates the lights 114 in a particular pattern and/or activates certain color or colors of the lights 114 and/or activates the lights 114 at a first rate. When a second voltage level is detected, the wearable electric field detector 20 activates the speaker 112 in a particular pattern which is different from the first voltage level and/or at a particular volume which is different from the first voltage level, and/or activates the lights 114 in a pattern which is different from the first voltage level and/or activates certain color or colors of the lights 114 which are different from the first voltage level and/or activates the lights 114 at a second rate which is different from the first voltage level. When a third voltage level is detected, the wearable electric field detector 20 activates the speaker 112 in a particular pattern which is different from the first and second voltage levels and/or at a particular volume which is different from the first and second voltage levels, and/or activates the lights 114 in a pattern which is different from the first and second voltage levels and/or activates certain color or colors of the lights 114 which are different from the first and second voltage levels and/or activates the lights 114 at a second rate which is different from the first and second voltage levels. The speaker 112 and the lights 114 are directed up towards the head of the wearer to help improve recognition of the indication of the high voltage.

Figure 25:
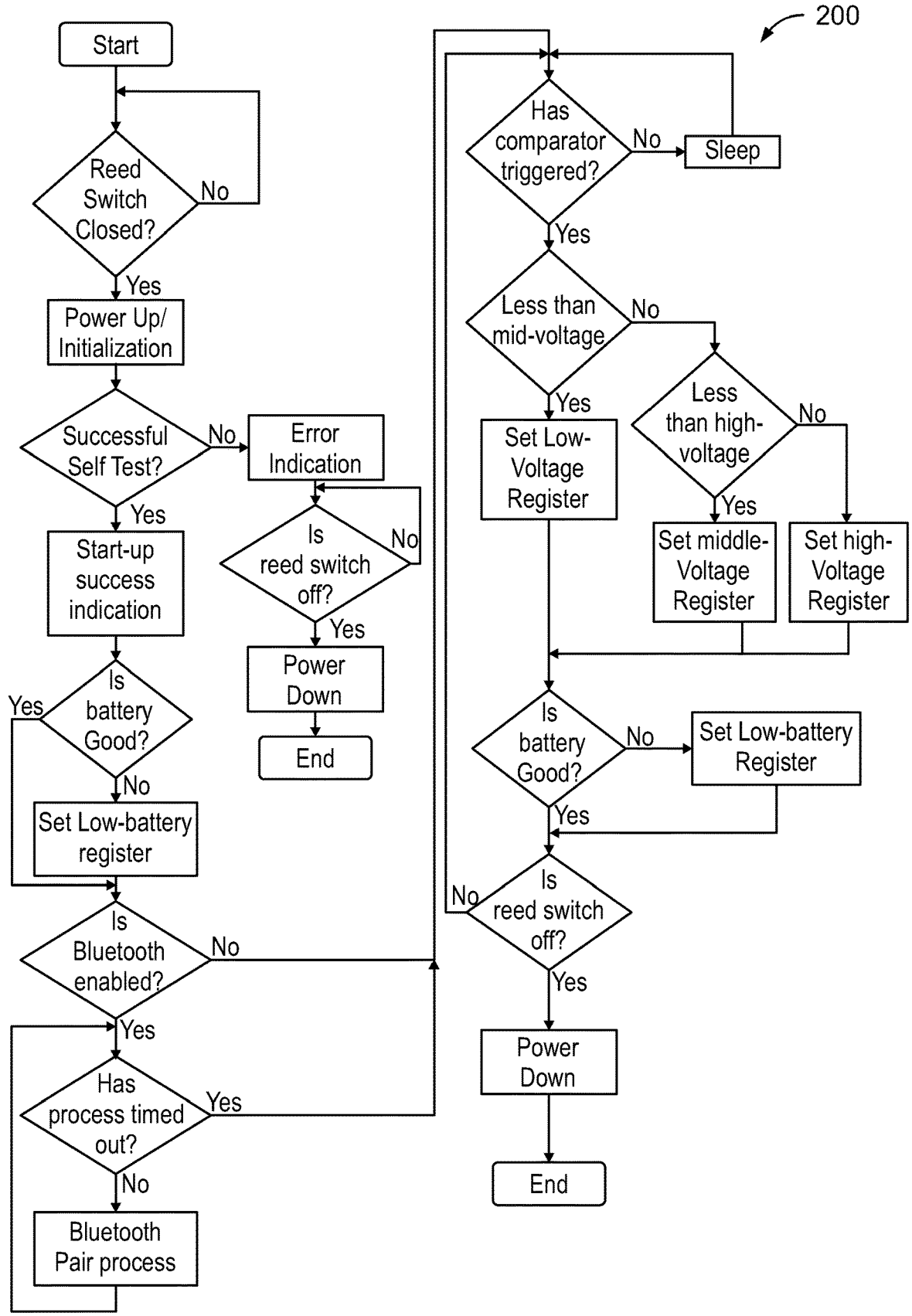
FIGS. 25 and 26 show a flowchart of example logic of the firmware of the wearable electric field detector.
Figure 26:
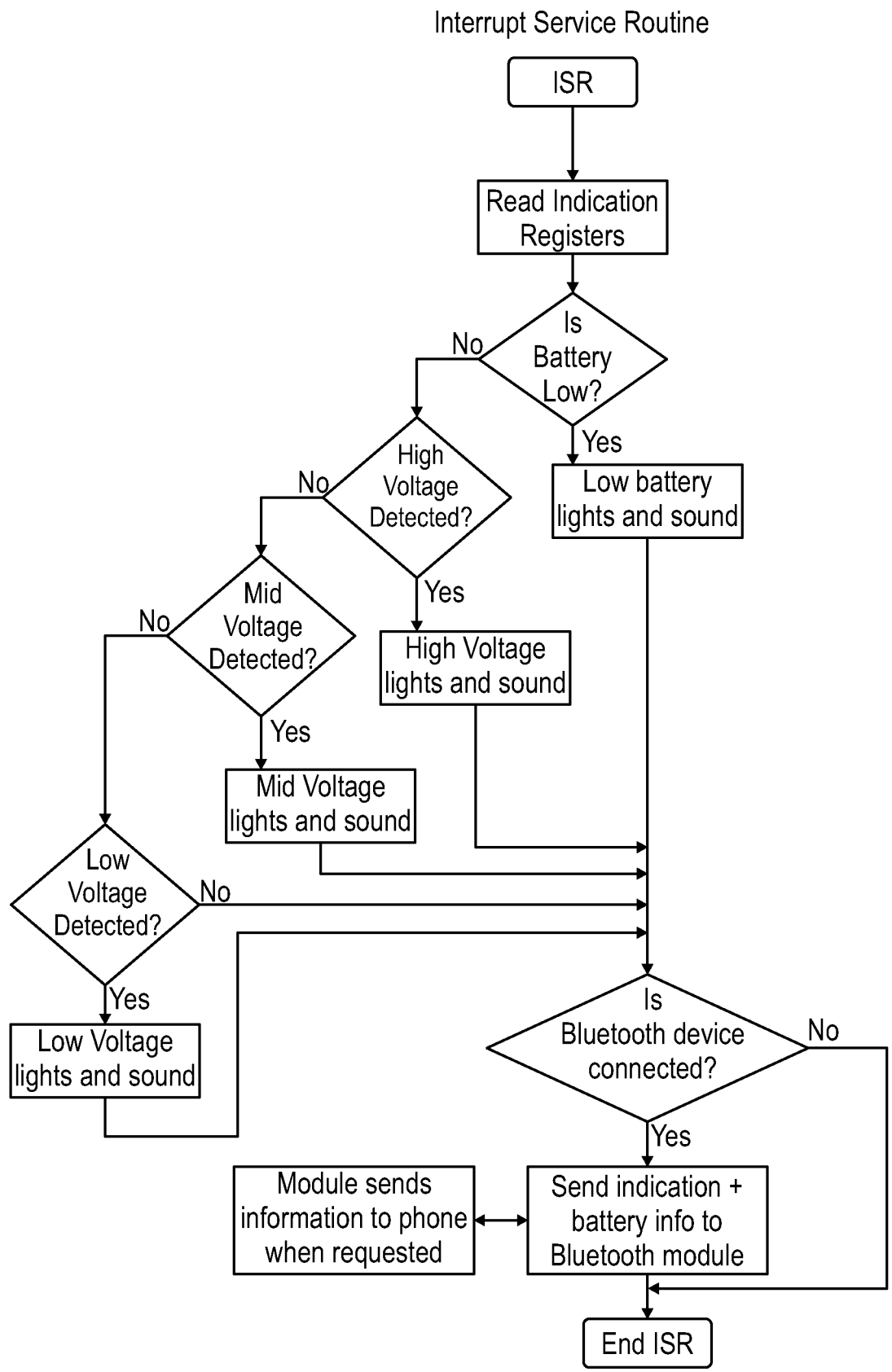

FIGS. 25 and 26 show a flowchart of an example logic 200 of the firmware of the wearable electric field detector 20. The firmware includes an Interrupt Service Routine (ISR). The ISR is a set of code that is repeated after a small fixed time interval (about 67 milliseconds), so in the main loop the processor 178 is reading voltages and setting registers, but no change in indication (sound or lights) takes place until the next ISR.

The gaskets 48, 76, 140 deter the ingress of water into the inner housing 22. The water-resistant fabric 110 deters the ingress of water into the housing 108 of the speaker 112.

While particular embodiments are illustrated in and described with respect to the drawings, it is envisioned that those skilled in the art may devise various modifications without departing from the spirit and scope of the appended claims. It will therefore be appreciated that the scope of the disclosure and the appended claims is not limited to the specific embodiments illustrated in and discussed with respect to the drawings and that modifications and other embodiments are intended to be included within the scope of the disclosure and appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the disclosure and the appended claims.

What is claimed is:

1. A wearable electric field detector configured to be worn by a wearer in an environment, comprising:
   an outer housing defining a first cavity;
   an inner housing comprising a body and and a cap extending from the body, the body being seated within the first cavity and the cap extending from the first cavity, the body defining a second cavity therein which is closed by the cap, the inner housing being movable relative to the outer housing;
   field detection circuitry disposed within the second cavity and configured to detect voltage in an electric field in the environment around the wearer; and
   at least one of a speaker and a light source mounted in the inner housing and in communication with the field detection circuitry and configured to be activated by the field detection circuitry, wherein the body is concealed within the first cavity when the inner housing is in a closed position and the field detection circuitry is not active, and the body having the field detection circuitry therein is partially within the first cavity and partially extends out of the first cavity to be partially visible when in an open position and the field detection circuitry is active.

2. The wearable electric field detector of claim 1, wherein the outer housing is a first color and the body is a second, different color.

3. The wearable electric field detector of claim 1, wherein the inner housing slides relative to the outer housing.

4. The wearable electric field detector of claim 1, wherein the cap has an overhang which extends outwardly from the outer housing which prevents the further entry of the cap into the outer housing.

5. The wearable electric field detector of claim 1, wherein the at least one of a speaker and a light source mounted in the inner housing are proximate to an upper end of the inner housing.

6. The wearable electric field detector of claim 1, wherein the body has a battery door attached thereto, the battery door being detachable from the body.

7. The wearable electric field detector of claim 6, wherein the outer housing has a battery door opening provided therethrough, the battery door opening being larger than the battery door such that the battery door can pass therethrough.

8. The wearable electric field detector of claim 6,
wherein the battery door has an upper portion and a lower portion, the lower portion extending outwardly from the upper portion, the lower portion extending into the battery door opening when in the closed or in the open position, and
wherein the upper portion of the battery door is visible through the battery door opening when in the closed position, and at least a portion of the upper portion of the battery door is not visible through the battery door opening when in the open position.

9. The wearable electric field detector of claim 1,
wherein the body has a battery door attached thereto, the battery door being detachable from the body only when the inner housing is in the closed position; and
wherein the field detection circuitry includes a self-test circuit which is activated only when the inner housing is moved from the closed position to the open position.

10. The wearable electric field detector of claim 9, wherein the field detection circuitry is configured to indicate results from the self-test circuit by emitting a turn-on audio tone from the speaker and/or activating the light source.

11. The wearable electric field detector of claim 10, wherein the field detection circuitry is configured to activate the speaker to emits a turn-off audio tone when the inner housing is moved from the open position to the closed position.

12. The wearable electric field detector of claim 1, wherein the speaker and the light source are mounted in the inner housing.

13. The wearable electric field detector of claim 12, wherein the cap has at least one opening therethrough, and further comprising a water-resistant fabric covering the at least one opening.

14. The wearable electric field detector of claim 1, further comprising a switch on the inner housing which is in communication with the field detection circuitry and a magnet on the outer housing, wherein the switch and the magnet are not in proximity to each other when the inner housing in the closed position, and wherein the switch and the magnet are in proximity to each other when in the open position such that the switch is activated which in turn, activates the field detection circuitry.

15. The wearable electric field detector of claim 1, wherein the field detection circuitry includes a self-test circuit which is activated only when the inner housing is moved from the closed position to the open position.

16. The wearable electric field detector of claim 15, wherein the field detection circuitry is configured to indicate results from the self-test circuit by emitting a turn-on audio tone from the speaker and/or activating the light source.

17. The wearable electric field detector of claim 16, wherein the field detection circuitry is configured to activate the speaker to emits a turn-off audio tone when the inner housing is moved from the open position to the closed position.

18. The wearable electric field detector of claim 1, wherein the field detection circuitry is configured to cause the speaker to emit a turn-on audio tone from the speaker when the inner housing is moved from the open position to the open position, and the field detection circuitry is configured to cause the speaker to emit a turn-off audio tone from the speaker when the inner housing is moved from the open position to the closed position, the turn-on audio tone being different from the turn-off audio tone.

19. The wearable electric field detector of claim 1, further comprising a lanyard attached to the outer housing.

20. The wearable electric field detector of claim 19, wherein the lanyard is fireproof.

21. A wearable electric field detector configured to be worn by a wearer in an environment, comprising:
an outer housing;
an inner housing within the outer housing, the inner housing comprising a body and cap, the cap extending from the body and extending from the outer housing, the body defining a cavity therein which is closed by the cap, the inner housing being movable relative to the outer housing, wherein the body is concealed within the outer housing when the inner housing is in a closed position, and the body is partially visible when the inner housing is in an open position;
field detection circuitry disposed within the cavity of the inner housing and configured to detect multiple voltage levels in an electric field in the environment around the wearer when in the inner housing is in the open position; and
at least one of a speaker and a light source mounted in the inner housing and in communication with the field detection circuitry and configured to be activated by the field detection circuitry,
wherein when a first voltage level is detected, the field detection circuitry activates the speaker in a particular pattern and/or at a particular volume, and/or activates the light source in a particular pattern and/or activates certain color or colors of the light source and/or activates the light source at a first rate, and
wherein when a second voltage level is detected, the field detection circuitry activates the speaker in a particular pattern which is different from the particular pattern of the speaker activated for the first voltage level and/or at a particular volume which is different from the particular volume of the speaker activated for the first voltage level, and/or activates the light source in a pattern which is different from the particular pattern of the light source activated for the first voltage level and/or activates certain color or colors of the light source which are different from the certain color or colors of the light source activated for first voltage level and/or activates the light source at a second rate which is different from the first rate.

22. The wearable electric field detector of claim 21, wherein when a third voltage level is detected, the field detection circuitry activates the speaker in a particular pattern which is different from the particular patterns of the speaker activated for the first and second voltage levels and/or at a particular volume which is different from the particular volumes of the speaker activated for the first and second voltage levels, and/or activates the light source in a pattern which is different from the particular patterns of the light source activated for the first and second voltage levels and/or activates certain color or colors of the light source which are different from certain color or colors of the light source activated for the first and second voltage levels and/or activates the light source at a third rate which is different from the first and second rates.

23. A wearable electric field detector configured to be worn by a wearer in an environment, comprising:
an outer housing;
an inner housing within the outer housing, the inner housing comprising a body and cap, the cap extending from the body and always extending from the outer housing, the body defining a cavity therein which is closed by the cap, the inner housing being slidable relative to the outer housing when a user grasps the cap and slides the inner housing relative to the outer housing from a closed position to an open position, wherein the body is concealed within the outer housing and the cap is visible when the inner housing is in the closed position, and the body is only partially visible and the cap is visible when the inner housing is in the open position;
field detection circuitry disposed within the cavity of the inner housing and configured to detect voltage in an electric field in the environment around the wearer;
batteries mounted within the cavity;
a switch, sensor, or combination thereof configured to be triggered to provide an electrical connection between the batteries and the field detection circuitry when the inner housing is moved from the closed position to the open position; and
at least one of a speaker and a light source mounted in the inner housing and in communication with the field detection circuitry and configured to be activated by the field detection circuitry.

* * * * *